(12) United States Patent
Chatterjee (10) Patent No.: US 10,513,778 B2
(45) Date of Patent: Dec. 24, 2019

(54) **NATIVE OR UNCONTROLLED OXIDE REDUCTION BY HWCVD H* USING SPECIFIC METAL CHAMBER LINER**

(71) Applicant: Applied Materials, Inc., Santa Clara, CA (US)

(72) Inventor: Sukti Chatterjee, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 16/043,998

(22) Filed: Jul. 24, 2018

(65) Prior Publication Data
US 2019/0093232 A1    Mar. 28, 2019

Related U.S. Application Data

(60) Provisional application No. 62/561,984, filed on Sep. 22, 2017.

(51) Int. Cl.
*C23C 16/56*    (2006.01)
*C23C 16/455*   (2006.01)
(Continued)

(52) U.S. Cl.
CPC ............ *C23C 16/56* (2013.01); *C23C 16/045* (2013.01); *C23C 16/06* (2013.01); *C23C 16/22* (2013.01);
(Continued)

(58) Field of Classification Search
CPC ..... C23C 16/56; C23C 16/22; C23C 16/4557; C23C 16/0236; C23C 16/0245; H01L 21/02041; H01L 21/02076
(Continued)

(56) References Cited

U.S. PATENT DOCUMENTS 6,652,765 B1 * 11/2003 Beaty ................. A61C 8/00
                                                         216/100
9,653,267 B2    5/2017 Carducci et al.
(Continued)

OTHER PUBLICATIONS

Gong, Dawei et al., "Titanium oxide nanotube arrays prepared by anodic oxidation", Materials Research Society, Dec. 12, 2001, pp. 3331-3334.
(Continued)

*Primary Examiner* — Michael P Wieczorek
(74) *Attorney, Agent, or Firm* — Patterson & Sheridan, LLP (57) ABSTRACT

Apparatus and methods are disclosed to provide arrays of substantially oxide-free structures, such as titanium nanotubes or microwells. In one aspect, a hot wire chemical vapor deposition (HWCVD) chamber includes a metal chamber liner manufactured from one or more of aluminum (Al), lithium (Li), magnesium (Mg), calcium (Ca), zirconium (Zr), strontium (Sr), cerium (Ce), barium (Ba), beryllium (Be), lanthanum (La), thorium (Th), and alloys thereof. In one aspect, a method includes positioning a substrate having an array of titanium oxide structures with an oxide layer on surfaces thereof in the HWCVD chamber having the metal chamber liner, exposing the titanium oxide structures with the oxide layer on surfaces thereof to hydrogen (H) radicals, and removing the oxide layer to form well-ordered titanium structures.

8 Claims, 5 Drawing Sheets

(51) Int. Cl.
*C23C 16/22* (2006.01)
*C23C 16/06* (2006.01)
*C23C 16/46* (2006.01)
*C23C 16/48* (2006.01)
*C23C 16/04* (2006.01)
*C23C 16/52* (2006.01)

(52) U.S. Cl.
CPC .......... *C23C 16/4557* (2013.01); *C23C 16/46* (2013.01); *C23C 16/481* (2013.01); *C23C 16/52* (2013.01)

(58) Field of Classification Search
USPC ...................................................... 134/19, 31
See application file for complete search history.

(56) References Cited

U.S. PATENT DOCUMENTS

| | | |
|---|---|---|
| 2008/0081464 A1 | 4/2008 | Matsuda et al. |
| 2012/0312326 A1* | 12/2012 | Chatterjee ........... C23C 16/0236 134/19 |
| 2013/0160794 A1 | 6/2013 | Griffith Cruz et al. |
| 2013/0320001 A1 | 12/2013 | Kondo |
| 2016/0111342 A1 | 4/2016 | Huang et al. |
| 2017/0062210 A1 | 3/2017 | Visser et al. |
| 2017/0275753 A1 | 9/2017 | Baluja et al. |

OTHER PUBLICATIONS

International Search Report and Written Opinion dated Oct. 31, 2018 for Application No. PCT/US2018/043559.

* cited by examiner

NATIVE OR UNCONTROLLED OXIDE REDUCTION BY HWCVD H* USING SPECIFIC METAL CHAMBER LINER

CROSS-REFERENCE TO RELATED APPLICATIONS

This application claims benefit of U.S. Provisional Patent Application Ser. No. 62/561,984, filed on Sep. 22, 2017, which is herein incorporated by reference in its entirety.

BACKGROUND

Field

Aspects disclosed herein relate to methods of manufacturing arrays of substantially oxide-free structures, such as titanium nanotubes or microwells.

Description of the Related Art

Titanium oxide ($TiO_x$) is an example of a useful material for various physical and chemical functions, including for use as a gas, ion, or biological species-sensing material. Accordingly, $TiO_x$ is being used for various biometric sensing applications, such as in a phosphate sensor for DNA sequencing. Conventionally, porous $TiO_x$ films are formed on a substrate by anodization methods, such as anodic oxidation of a titanium (Ti) sheet in an aqueous solution containing hydrofluoric (HF) acid.

One problem with conventionally manufactured TiOx structure arrays, however, is that the formed structures have unwanted oxides, such as native oxides or otherwise uncontrolled oxides, on the surfaces thereof. The oxides are generally the result of anodization or other process steps. The native oxides negatively affect device uniformity and performance, for example, by increasing a signal-to-noise ratio in a biological species-sensing device. Additionally, conventionally manufactured arrays are not highly ordered.

Therefore, there is a need in the art for methods of reducing or eliminating native oxides on the arrays of titanium oxide structures, such as nanotubes or microwells, or other titanium oxide films.

SUMMARY

Apparatus and methods are disclosed to provide arrays of substantially oxide-free structures, such as titanium nanotubes or microwells. In one aspect, a hot wire chemical vapor deposition (HWCVD) chamber includes a metal chamber liner manufactured from one or more of aluminum (Al), lithium (Li), magnesium (Mg), calcium (Ca), zirconium (Zr), strontium (Sr), cerium (Ce), barium (Ba), beryllium (Be), lanthanum (La), thorium (Th), and alloys thereof. In one aspect, a method includes positioning a substrate having an array of titanium oxide structures with an oxide layer on surfaces thereof in the HWCVD chamber having the metal chamber liner, exposing the titanium oxide structures with the oxide layer on surfaces thereof to hydrogen (H) radicals, and removing the oxide layer to form well-ordered titanium structures.

In one aspect, a method for reducing native oxides is disclosed. The method includes positioning a substrate having an array of metal structures formed thereon in an HWCVD process chamber, the array of metal structures having an oxide layer formed thereon, the HWCVD process chamber, comprising one or more metal chamber liners for reducing the oxide layer, exposing the oxide layer to hydrogen radicals, and removing the oxide layer from the array of metal structures.

In another aspect, positioning a substrate having an array of titanium oxide structures formed thereon in an HWCVD process chamber, the titanium oxide structures having an oxide layer formed thereon, the HWCVD process chamber having one or more metal chamber liners for reducing the oxide layer, delivering hydrogen gas into the HWCVD process chamber, heating one or more filaments disposed in the HWCVD process chamber to a temperature sufficient to dissociate the hydrogen gas, exposing the oxide layer to the dissociated hydrogen gas to form reduced titanium oxide and hydrogen byproducts, and removing the oxide layer from the titanium oxide structures to form titanium structures by reacting a metal of the one or more chamber liners with the titanium oxide and hydrogen byproducts to form titanium and metal oxide.

In yet another aspect, an HWCVD process chamber is disclosed. The HWCVD process chamber includes a chamber body having one or more chamber walls and a chamber lid, the chamber body defining a processing volume, a substrate support disposed in the processing volume, one or more filaments disposed in the processing volume, and one or more metal chamber liners coupled to the process chamber.

BRIEF DESCRIPTION OF THE DRAWINGS

So that the manner in which the above recited features of the present disclosure can be understood in detail, a more particular description of the disclosure, briefly summarized above, may be had by reference to aspects, some of which are illustrated in the appended drawings. It is to be noted, however, that the appended drawings illustrate only exemplary aspects and are therefore not to be considered limiting of its scope. The disclosure may admit to other equally effective aspects.

To facilitate understanding, identical reference numerals have been used, where possible, to designate identical elements that are common to the figures. It is contemplated that elements and features of one aspect may be beneficially incorporated in other aspects without further recitation.

DETAILED DESCRIPTION

Apparatus and methods are disclosed to provide arrays of substantially oxide-free structures, such as titanium nanotubes or microwells. In one aspect, a hot wire chemical vapor deposition (HWCVD) chamber includes a metal chamber liner manufactured from one or more of aluminum (Al), lithium (Li), magnesium (Mg), calcium (Ca), zirconium (Zr), strontium (Sr), cerium (Ce), barium (Ba), beryllium (Be), lanthanum (La), thorium (Th), and alloys thereof. In one aspect, a method includes positioning a substrate having an array of titanium oxide structures with an oxide layer on surfaces thereof in the HWCVD chamber having the metal chamber liner, exposing the titanium oxide structures with the oxide layer on surfaces thereof to hydrogen (H) radicals, and removing the oxide layer to form well-ordered titanium structures.

Methods described herein will refer to reduction of a $TiO_x$ native oxide layer of titanium nanotubes or microwells as an example. However, it is also contemplated that the described methods are useful to reduce native oxides on any structures, such as other metal structures or carbon structures. The described methods are also useful for reducing native oxides on films, such as high quality titanium dioxide ($TiO_2$) films deposited by atomic layer deposition (ALD). Additionally, the described methods are useful to remove any uncontrolled or otherwise unwanted oxides.

Figure 1:
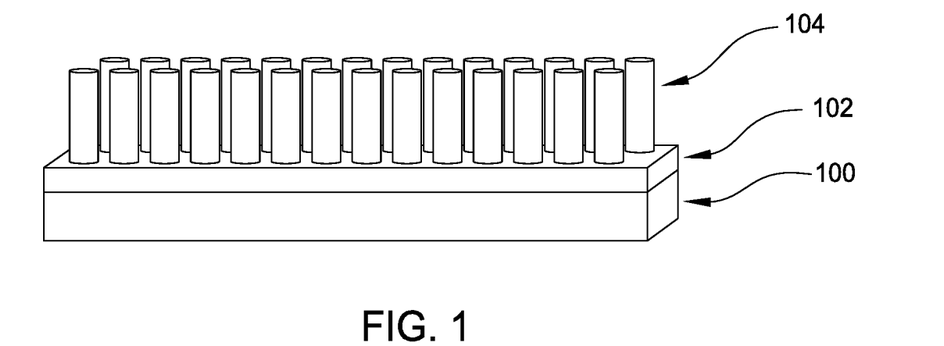
FIG. 1 is a perspective side view of a portion of a substrate having an array of titanium structures formed thereon.
Figure 2:
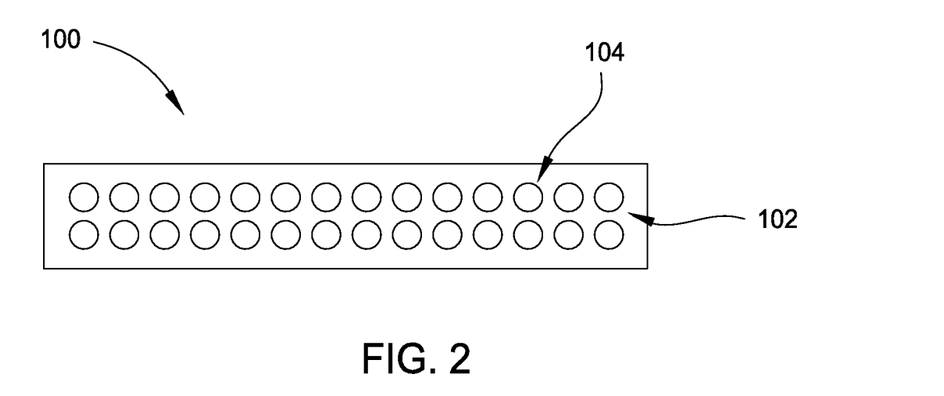
FIG. 2 is a top view of the array of titanium structures of FIG. 1.

FIG. 1 is a perspective side view of a portion of a substrate 100 having an array of titanium structures 104 formed thereon. FIG. 2 is a top view of the array of titanium structures 104 of FIG. 1. As shown in FIG. 1, a $TiO_x$ barrier layer 102 is disposed over the substrate 100. An array of titanium structures 104 is formed on the $TiO_x$ barrier layer 102. The $TiO_x$ barrier layer 102 provides a bottom surface of the titanium structures 104.

The substrate 100 is generally any substrate having a porous layer thereon. A porous layer is generally any layer having natural pores thereon. In one aspect, the substrate 100 has a porous titanium layer therein. Some examples of porous titanium, which is useful for gas and biological-species sensing, include uniform pore structures such as nanotubes and microwells, bimodal pore structures, gradient pore structures, honeycomb structures, and closed-pore structures. As shown in FIG. 1, the titanium structures 104 are nanotubes.

Figure 3:
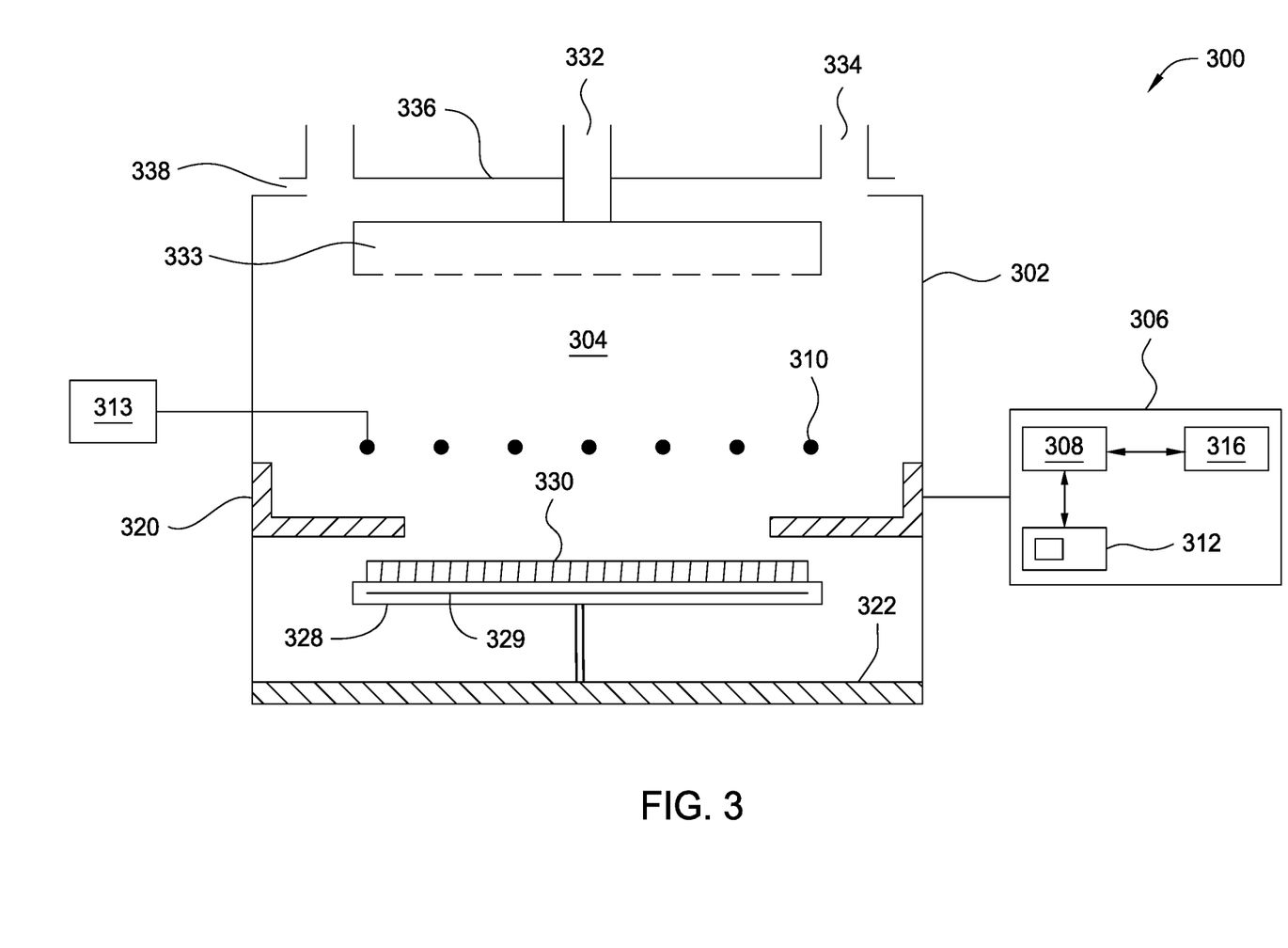
FIG. 3 is an HWCVD process chamber suitable for performing process flows described herein.

FIG. 3 is an HWCVD process chamber 300 suitable for performing process flows described herein. The HWCVD process chamber 300 generally includes a chamber body 302 including chamber walls, and a lid 336, which define an internal processing volume 304. One or more filaments 310 are disposed within the chamber body 302, for example, within the internal processing volume 304. The one or more filaments 310 generally comprise an HWCVD source. The one or more filaments 310 are generally manufactured from any suitable conductive material(s), for example, tungsten, tantalum, iridium, nickel-chrome, and palladium. The one or more filaments 310 are generally any thickness suitable to provide a desired temperature to facilitate a process in the HWCVD process chamber 300.

A power supply 313 is coupled to the one or more filaments 310 to provide current to heat the one or more filaments 310. A substrate support 328 is positioned under the one or more filaments 310 to support a substrate 330 (e.g., substrate 100 described above). The substrate support 328 is generally stationary for static deposition or moveable for dynamic deposition as the substrate 330 passes under the one or more filaments 310. In some aspects, the substrate support 328 comprises a heater 329 within the substrate support 328 to facilitate controlling a temperature of the substrate 330. The heater 329 is generally any type of heater, for example, a resistive heater.

The chamber body 302 further includes one or more gas inlets 332 (one is shown) to provide one or more process gases and one or more outlets 334 (two are shown) coupled to a vacuum pump to maintain a suitable operating pressure within the HWCVD process chamber 300 and to remove excess process gases and/or process byproducts. The gas inlet 332 generally feeds into a showerhead 333, or other suitable gas distribution element, to distribute the gas uniformly, or as desired, over the one or more filaments 310.

The chamber body 302 further includes one or more metal chamber liners 322 manufactured from any metal, or alloys or combinations thereof, suitable for reducing oxides, such as native oxides. As illustrated in FIG. 3, the metal material is configured as one or more metal chamber liners 322. In further aspects the metal may be disposed or mounted anywhere in the HWCVD process chamber 300 in any suitable manner, for example, as a coupon in the HWCVD process chamber 300.

The metal material(s) of the one or more metal chamber liners 322 is generally selected to reduce oxides on substrates surfaces, such as native oxide layers on the surfaces of the one or more titanium structures 104 on the substrate 100. In some aspects, the one or more metal chamber liners 322 are manufactured from metals having a higher oxidation rate than titanium, for example at temperatures below the melting point of titanium, according to the Ellingham Diagram. Examples of the metal material(s) include, but not limited to, Al, Li, Mg, Ca, Zr, Sr, Ce, Ba, Be, La, Th, and alloys and/or combinations thereof. In further aspects, the one or more metal chamber liners 322 are manufactured from metals having higher oxidation rates than other metals, for example, at temperatures below the melting point of the other metals.

The one or more metal chamber liners 322 are generally removable, replaceable, and/or cleanable. In one aspect, the one or more metal chamber liners 322 are removable from the HWCVD process chamber 300 for maintenance and cleaning by opening an upper portion of the HWCVD process chamber 300. For example, in some aspects, the lid 336 of the HWCVD process chamber 300 is coupled to the chamber body 302 along a flange 338 that supports the lid 336 and provides a surface to secure the lid 336 to the chamber body 302.

In further embodiments, the HWCVD process chamber 300 also includes one or more chamber shields 320.

The HWCVD process chamber 300 generally further includes a controller 306 coupled to the HWCVD process chamber 300 to control the operation thereof in accordance with methods disclosed herein. The controller 306 generally includes a central processing unit (CPU) 308, a memory 312, and support circuits 316 for the CPU 308.

Figure 4:
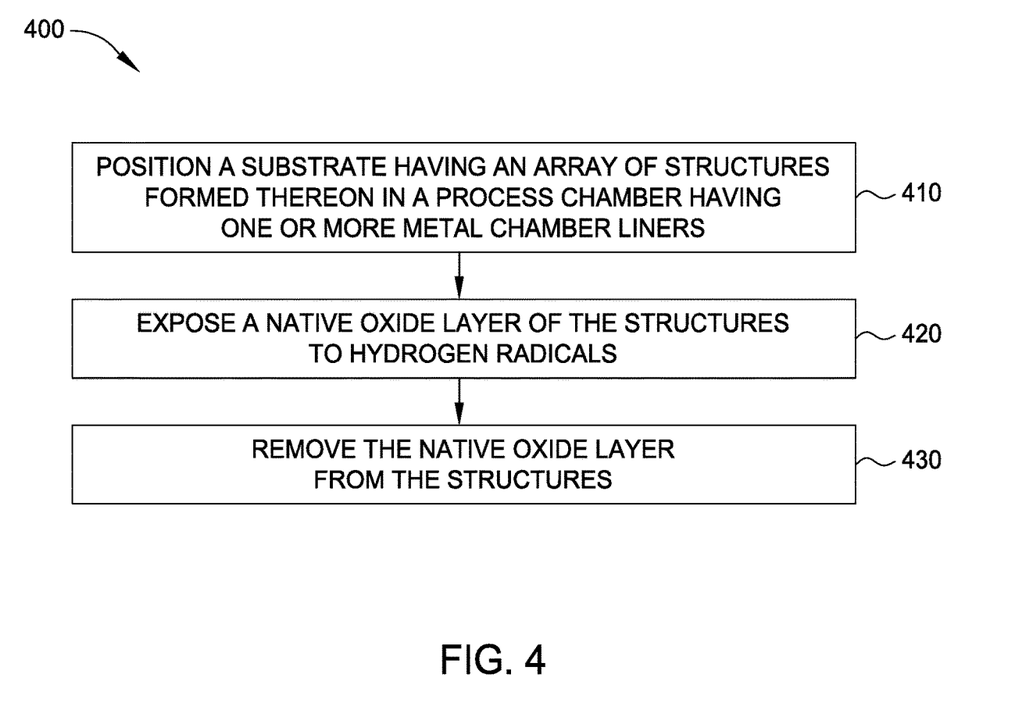
FIG. 4 is a process flow for reducing oxides from a $TiO_x$ structure.
Figure 5A:
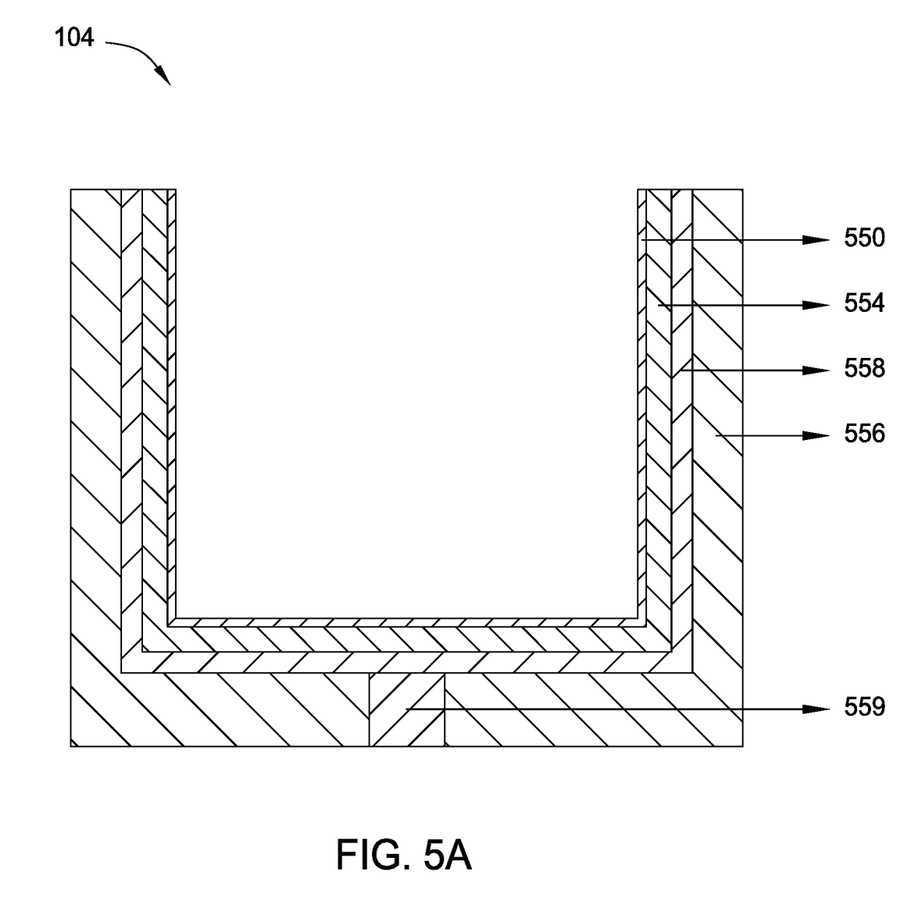
FIGS. 5A-5B depict cross-sectional views of a titanium structure formed according to a process flow disclosed herein.
Figure 5B:
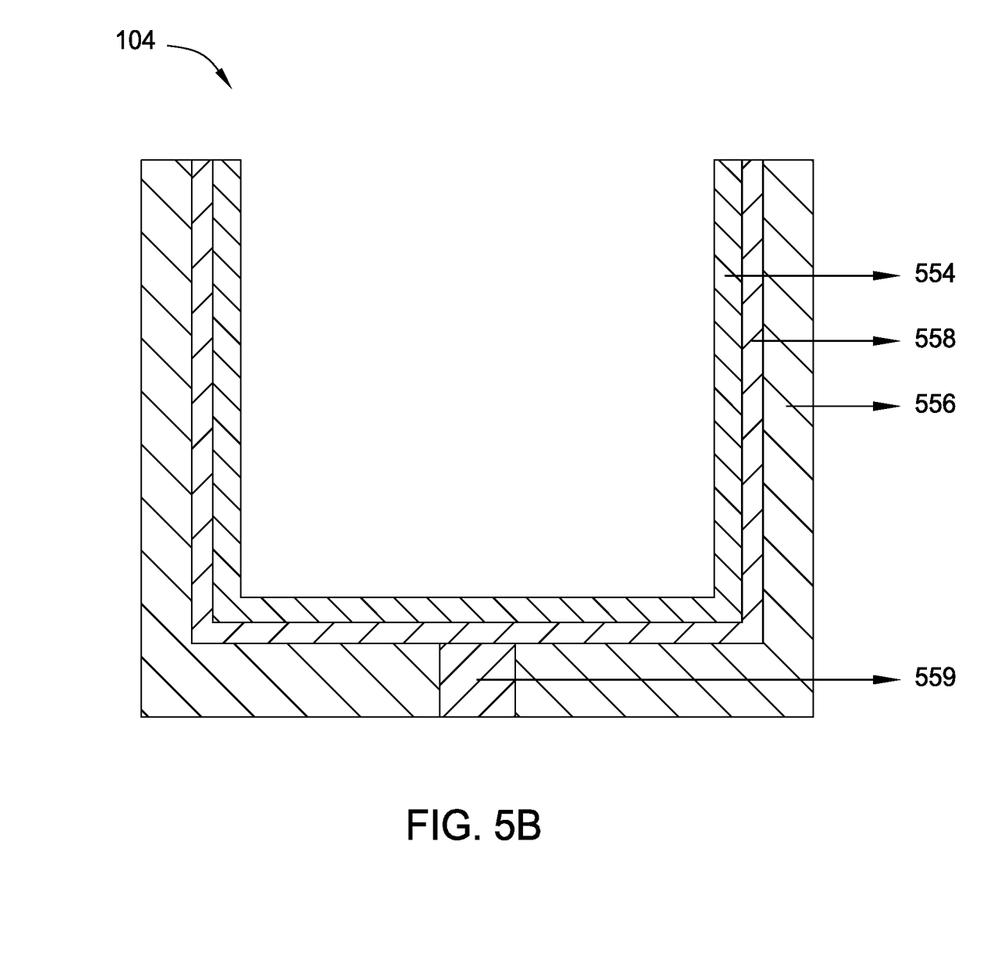

FIG. 4 is a process flow 400 for reducing oxides from a structure, such as a $TiO_x$ structure. FIGS. 5A-5B depict cross-sectional views of a titanium structure 104 formed according to process flows described herein, such as at various operations of the process flow 400.

The process flow 400 begins at operation 410 by positioning a substrate 100 having an array of structures, such as titanium structures 104, for example $TiO_x$ structures, formed thereon in a process chamber, such as the HWCVD process chamber 300.

Prior to operation 410, the substrate 100 having the array of titanium structures 104 formed thereon is generally formed by any suitable method. In one aspect, an array of titanium structures 104 is formed by depositing a titanium layer, such as titanium thin film, over the substrate 100 and anodizing the titanium layer in a hydrofluoric (HF) acid solution to form $TiO_x$ structures. As shown in FIG. 5A, the formed titanium structure 104, which may be a titanium dioxide ($TiO_2$) microwell, includes a native oxide layer 550 on the surface thereof, as an example. However, the process flow 400 is useful for removing generally any oxides from a substrate surface. In some aspects, the formed titanium structure 104 also includes various additional layers, including but not limited to, a complementary metal-oxide semiconductor (CMOS) stack 556 having a sensor 559, for example a biometric sensor, therein, a titanium nitride (TiN) layer 558 and a titanium (Ti) layer 554. As discussed above, the native oxide layer 550 affects device uniformity and performance.

At operation 420, the substrate is exposed to, or bombarded with, hydrogen radicals to reduce the native oxide layer 550. The hydrogen radicals react with oxides in the native oxide layer 550 and provide oxide reduction as well as formation of intermediate byproducts. In the aspect of a $TiO_x$ (e.g., $TiO_2$) structure shown in FIG. 5A, during a primary reaction, the hydrogen radicals react with the $TiO_x$ to form neutral titanium (Ti) and water ($H_2O$) byproducts. In a secondary reaction, the neutral titanium and $H_2O$ byproducts generally recombine to form TiO and $H_2$.

In one aspect, exposing the native oxide layer 550 to hydrogen radicals includes an HWCVD process. The HWCVD process generally includes delivering hydrogen ($H_2$) gas into a process chamber, such as the HWCVD process chamber 300, at any suitable flow rate, heating one or more filaments 310 disposed in the process chamber to a temperature sufficient to dissociate the $H_2$ gas and provide at least a portion of the energy for facilitating removal of the native oxide layer 550, and exposing the substrate 100 to the dissociated $H_2$ gas to facilitate removal of the native oxide layer 550. The one or more filaments 310 are generally heated to a temperature between about 1,200° C. and about 2,200° C. The temperature of a substrate heater is generally low, for example, between about 25° C. and about 400° C. The flow rate of the $H_2$ gas is generally between about 100 sccm (standard cubic centimeter per minute) and about 500 sccm, for example, about 400 sccm. The process chamber pressure is generally between about 0.1 torr (T) and about 10.0 T, for example, about 0.5 T. The duration of the HWCVD process is generally between about 50 seconds and about 120 minutes, for example, about 120 seconds.

In another aspect, exposing the native oxide layer 550 to hydrogen radicals includes introducing hydrogen radicals to a process chamber from a remote plasma source (RPS). As discussed above, the hydrogen radicals are useful for removing the native oxide layer 550. Suitable plasma precursors include unreactive gases, such as argon gas (Ar) and/or helium gas (He). A flow rate of $H_2$ is generally between about 100 sccm and about 600 sccm, for example, about 400 sccm. A flow rate of argon gas (Ar) is generally between about 100 sccm and about 2,000 sccm, for example, about 500 sccm. A flow rate of helium gas (He) is generally between about 100 sccm and about 2,000 sccm, for example, about 500 sccm. A process chamber pressure is generally between about 0.5 Torr and about 2 Torr, for example, 0.8 Torr.

At operation 430 the native oxide layer 550 is removed from the $TiO_x$ structures to form titanium structures. As discussed above the HWCVD process chamber 300 includes a metal chamber liner 322 manufactured from one or more metals (M) such as Al, Li, Mg, Ca, Zr, Sr, Ce, Ba, Be, La, Th, and alloys thereof. The one or more metals act as a reducing agent for the $TiO_x$/TiO such that the titanium gains an electron and the metal loses an electron. The one or more metals react with the byproducts of the hydrogen radical treatment, such as TiO and $H_2$ to form a metal oxide ($MO_x$) and reduced, neutral titanium since $MO_x$ is more stable than TiO. Removal of the oxide layer from the titanium oxide structures forms titanium structures, which may be used for various applications, including biometric sensing applications.

Apparatus and methods described herein provide for complete reduction of oxides on surfaces of structures, such as titanium nanotubes or microwells, using a combination of hydrogen radical exposure and one or more chamber liners comprising a metal suitable for reduction of oxides.

As shown in FIGS. 1 and 2, the array of titanium structures 104 formed by process flows described herein is well ordered. Well ordered generally means that the titanium structures 104 of the array are arranged in an orderly and substantially uniform way. In the aspect shown in FIG. 5B the formed titanium structure 104 may be a microwell having a sensor 559 for DNA sequencing. The formed titanium structure 104 is useful for applications, such as photocatalysis, solar cells, electrochromic devices, biomedical coatings, drug delivery, gas sensing, biological species sensing, and other biomedical applications. Since the native oxide layer 550 has been removed from the microwell, the signal-to-noise ratio is optimized, thus increasing device sensitivity, and the ability of the sensor 559 to be used for the various applications.

Benefits of the present disclosure include formation of well-ordered arrays of titanium structures, such as nanotubes or microwells, which provide improved performance because the oxide layer on surfaces thereof has been removed to form a titanium layer.

While the foregoing is directed to aspects of the present disclosure, other and further aspects of the disclosure may be devised without departing from the basic scope thereof, and the scope thereof is determined by the claims that follow.

What is claimed is:

1. A method for reducing oxides, comprising:
    positioning a substrate having an array of titanium oxide structures formed thereon in a hot wire chemical vapor deposition (HWCVD) process chamber, the array of titanium oxide structures having an oxide layer formed thereon, the HWCVD process chamber, comprising:
        one or more metal chamber liners for reducing the oxide layer;
    delivering hydrogen gas into the HWCVD process chamber;
    heating one or more filaments disposed in the HWCVD process chamber to a temperature sufficient to dissociate the hydrogen gas;
    exposing the oxide layer to the dissociated hydrogen gas to form reduced titanium oxide and hydrogen byproducts; and
    removing the oxide layer from the array of titanium oxide structures to form titanium structures by reacting a metal of the one or more metal chamber liners with the reduced titanium oxide and hydrogen byproducts to form titanium and metal oxide.

2. The method of claim 1, wherein the one or more metal chamber liners comprises a metal having a higher oxidation rate than titanium.

3. The method of claim 1, wherein the one or more metal chamber liners comprises one or more of lithium, magnesium, calcium, zirconium, strontium, cerium, barium, beryllium, lanthanum, and thorium.

4. The method of claim 1, wherein the one or more filaments are heated to a temperature between about 1,200° C. and about 2,200° C.

5. The method of claim 4, wherein a flow rate of the hydrogen gas is between about 100 sccm and about 500 sccm.

6. The method of claim 5, wherein a process chamber pressure is between about 0.1 torr (T) and about 10.0 T.

7. The method of claim 6, wherein the flow rate of the hydrogen gas is about 400 sccm.

8. The method of claim 7, wherein the process chamber pressure is about 0.5 T.

* * * * *